United States Patent
Praino, Jr. et al.

(10) Patent No.: US 11,393,607 B2
(45) Date of Patent: Jul. 19, 2022

(54) TRANSPARENT CONDUCTIVE FILM

(71) Applicant: Chasm Technologies, Inc., Canton, MA (US)

(72) Inventors: Robert F. Praino, Jr., Westwood, MA (US); Sean P. Arthur, Dorchester, MA (US); David J. Arthur, Norwood, MA (US)

(73) Assignee: Chasm Advanced Materials, Inc., Canton, MA (US)

( * ) Notice: Subject to any disclaimer, the term of this patent is extended or adjusted under 35 U.S.C. 154(b) by 0 days.

(21) Appl. No.: 15/789,402

(22) Filed: Oct. 20, 2017

(65) Prior Publication Data

US 2018/0061521 A1 Mar. 1, 2018

Related U.S. Application Data

(63) Continuation of application No. PCT/US2016/028598, filed on Apr. 21, 2016.
(Continued)

(51) Int. Cl.
*B32B 3/00* (2006.01)
*H01B 1/24* (2006.01)
(Continued)

(52) U.S. Cl.
CPC ............ *H01B 1/24* (2013.01); *B32B 5/02* (2013.01); *B32B 15/02* (2013.01); *B32B 15/08* (2013.01); *B32B 15/20* (2013.01); *B32B 27/20* (2013.01); *B82Y 10/00* (2013.01); *C08K 3/08* (2013.01); *C09D 5/24* (2013.01); *C09D 7/61* (2018.01); *C09D 11/52* (2013.01); *H01B 1/026* (2013.01); *H01B 1/22* (2013.01); *H05K 1/095* (2013.01); *H05K 1/097* (2013.01); *B32B 2305/10* (2013.01); *B32B 2305/30* (2013.01); *B32B 2307/202* (2013.01); *B32B 2307/40* (2013.01); *B32B 2311/08* (2013.01); *B32B 2311/12* (2013.01); *B32B 2313/04* (2013.01); *B32B 2457/00* (2013.01); *B32B 2551/00* (2013.01);
(Continued)

(58) Field of Classification Search
None
See application file for complete search history.

(56) References Cited

U.S. PATENT DOCUMENTS 8,455,043 B2 6/2013 Chang et al.
2005/0276924 A1 12/2005 Bielek et al.
(Continued)

FOREIGN PATENT DOCUMENTS

JP 2009163959 A * 7/2009

OTHER PUBLICATIONS

The International Preliminary Report on Patentability dated Nov. 2, 2017 for PCT Application No. PCT/US2016/028598.
(Continued)

*Primary Examiner* — Seth Dumbris
(74) *Attorney, Agent, or Firm* — Brian M. Dingman; Dingman IP Law, PC

(57) ABSTRACT

A transparent conductive film (10) that has a substrate (14) having a surface (14a, 14b), a nanowire layer (12, 12a) over one or more portions of the surface (14a, 14b) of the substrate (14), and a conductive layer (16, 16a) on the portions comprising the nanowire layer (12, 12a), the conductive layer (16, 16a) comprising carbon nanotubes (CNT) and a binder.

21 Claims, 1 Drawing Sheet

Related U.S. Application Data

(60) Provisional application No. 62/150,749, filed on Apr. 21, 2015.

(51) Int. Cl.
| | | |
|---|---|---|
| *H05K 1/09* | (2006.01) | |
| *H01B 1/22* | (2006.01) | |
| *B82Y 10/00* | (2011.01) | |
| *C09D 11/52* | (2014.01) | |
| *C09D 5/24* | (2006.01) | |
| *C09D 7/61* | (2018.01) | |
| *C08K 3/08* | (2006.01) | |
| *B32B 5/02* | (2006.01) | |
| *B32B 15/02* | (2006.01) | |
| *B32B 15/08* | (2006.01) | |
| *B32B 15/20* | (2006.01) | |
| *B32B 27/20* | (2006.01) | |
| *H01B 1/02* | (2006.01) | |
| *C08K 3/04* | (2006.01) | |

(52) U.S. Cl.
CPC ...... *C08K 3/041* (2017.05); *C08K 2003/0806* (2013.01); *H05K 2201/015* (2013.01); *H05K 2201/0108* (2013.01); *H05K 2201/0145* (2013.01); *H05K 2201/026* (2013.01); *H05K 2201/0323* (2013.01); *Y10T 428/24917* (2015.01)

(56) References Cited

U.S. PATENT DOCUMENTS

| | | | |
|---|---|---|---|
| 2008/0259262 A1* | 10/2008 | Jones | H05K 3/245 |
| | | | 349/139 |
| 2010/0136224 A1* | 6/2010 | Britz | C09D 7/70 |
| | | | 427/122 |
| 2011/0216020 A1* | 9/2011 | Lee | G06F 3/041 |
| | | | 345/173 |
| 2013/0122279 A1 | 5/2013 | Tsujimoto et al. | |
| 2014/0021400 A1 | 1/2014 | Coenjarts | |
| 2014/0308524 A1* | 10/2014 | Shim | H01B 1/02 |
| | | | 428/408 |
| 2014/0345917 A1 | 11/2014 | Takada et al. | |
| 2015/0064460 A1* | 3/2015 | Matsumoto | C09J 7/385 |
| | | | 428/355 AC |

OTHER PUBLICATIONS

The International Search Report and the Written Opinion of the International Searching Authority dated Jul. 15, 2016 for PCT Application No. PCT/US2016/028598.

\* cited by examiner

TRANSPARENT CONDUCTIVE FILM

CROSS-REFERENCE TO RELATED APPLICATIONS

This application is a continuation of, and claims priority to, PCT/US2016/028598, filed on 21 Apr. 2016, which itself claimed priority of Provisional application 62/150,749, filed on 21 Apr. 2015.

BACKGROUND

This disclosure relates to a transparent conductive film.

Many of the commonly available transparent conductive films used today rely upon inorganic compounds to provide the necessary conductivity. To provide the desired transparency, total film thickness is limited to about 50-100 nm. A common conductive thin film compound is indium tin oxide (ITO). ITO based thin films provide a sheet resistance of about 100 to about 300 ohms/square in the above mentioned transparency ranges. However, ITO based thin films suffer from brittleness and high costs.

SUMMARY

All examples and features mentioned below can be combined in any technically possible way.

In one aspect, a transparent conductive film (TCF) includes a substrate having a surface, a nanowire layer over one or more portions of the surface of the substrate, and a conductive layer on the portions comprising the nanowire layer, the conductive layer comprising carbon nanotubes (CNT) and a binder.

Embodiments may include one of the following features, or any combination thereof. The nanowires may be silver or copper nanowires. The nanowire layer may include a nanowire binder. The nanowire layer may include an additive that is arranged to modify an optical property of the nanowire layer, which in one non-limiting example is an optical brightener. The nanowire layer may have from about 10 mg/m$^2$ to about 100 mg/m$^2$ nanowires. The nanowire layer may be on portions that together comprise less than all of the surface of the substrate.

Embodiments may include one of the following features, or any combination thereof. The conductive layer binder may include a polymer, which in one non-limiting example is an ionomer. The ionomer may in one non-limiting example be a sulfonated tetrafluoroethylene based fluoropolymer-copolymer. The conductive layer binder may have an index of refraction no greater than about 1.5.

Embodiments may include one of the following features, or any combination thereof. The conductive layer may further include a viscosity modifier. The conductive layer may further include at least one of conductive nanoparticles and graphene. The TCF may also include a tie layer on the substrate that promotes adhesion to the substrate of at least one of the nanowires and the CNT. The tie layer may include a polymer such as a methylmethacrylate copolymer. The tie layer may have an additive that is arranged to modify an optical property of the tie layer. The substrate may have two opposed surfaces; wherein there are two nanowire layers, one each on one or more portions of both such surfaces; and wherein there is a conductive layer on both nanowire layers.

Also featured herein is a method of producing a transparent conductive film (TCF), comprising providing a substrate having a surface, depositing a nanowire layer over one or more portions of the surface of the substrate, and patterning a conductive layer on the portions comprising the nanowire layer, the conductive layer comprising carbon nanotubes (CNT) and a binder.

Embodiments may include one of the following features, or any combination thereof. The nanowires may be silver or copper nanowires. The nanowire layer may have a nanowire binder. The nanowire layer may include an additive that is arranged to modify an optical property of the nanowire layer; the additive may be an optical brightener. The nanowire layer may have from about 10 mg/m$^2$ to about 100 mg/m$^2$ nanowires. The nanowire layer may be on portions that together comprise less than all of the surface of the substrate.

Embodiments may include one of the following features, or any combination thereof. The conductive layer binder may include a polymer, which may be an ionomer such as but not limited to a sulfonated tetrafluoroethylene based fluoropolymer-copolymer. The conductive layer binder may have an index of refraction no greater than about 1.5.

Embodiments may include one of the following features, or any combination thereof. The conductive layer may further include a viscosity modifier. The viscosity modifier may be a fugitive material. The conductive layer may also include at least one of conductive nanoparticles and graphene. The substrate may have two opposed surfaces, and there may be two nanowire layers, one each on one or more portions of both such surfaces and a conductive layer on both nanowire layers Embodiments may include one of the following features, or any combination thereof. The method may further include creating on the top surface of the substrate, before the depositing step, a tie layer that promotes adhesion to the substrate of at least one of the nanowires and the CNT. The tie layer may include an additive that is arranged to modify an optical property of the tie layer. The tie layer may include a polymer such as a methylmethacrylate copolymer. The conductive layer may be patterned on less than all of the nanowire layer, leaving exposed nanowires, and the exposed nanowires may then be removed,

DETAILED DESCRIPTION

The disclosure describes transparent conductive films (TCF). The transparent conductive films comprise metal nano-wires, typically silver nano-wire (AgNW) and carbon nanotubes (CNT) carried by a variety of substrates.

Figure 1:
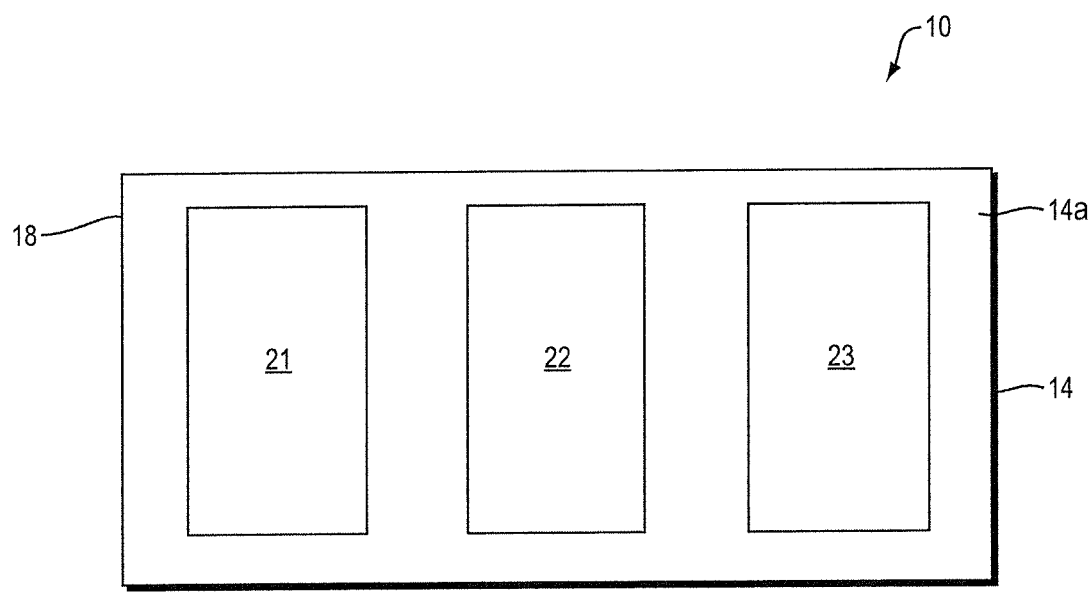
FIG. 1 is a top view of a transparent conductive film comprised of a first metal nano-wire layer, over-coated with a conductive layer that includes carbon nanotubes (CNT) and binder.
Figure 2:
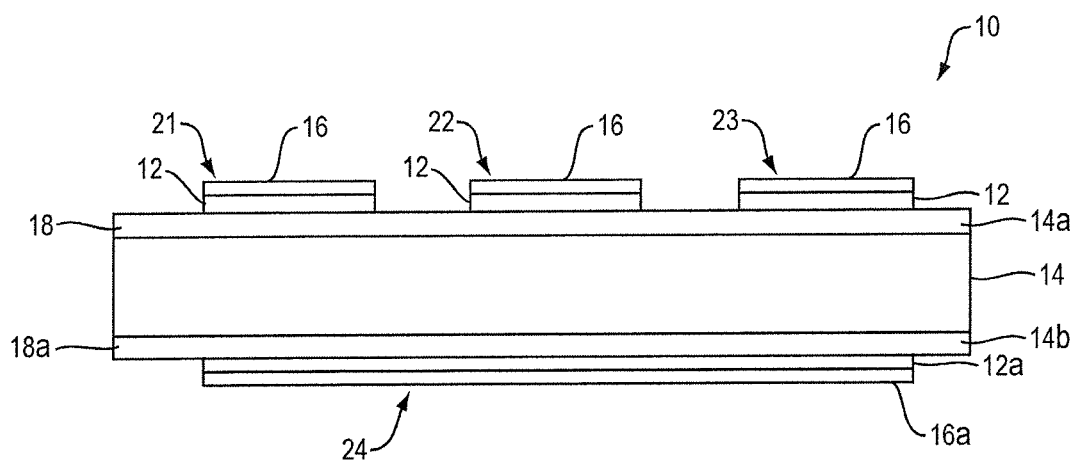
FIG. 2 is a side-view of the transparent conductive film of FIG. 1.

With reference to the drawings, a TCF 10, FIGS. 1 and 2, comprises a metal nano-wire layer 12 on one or more portions of a substrate 14 overcoated with a conductive CNT layer 16. The TCF typically has excellent electrical conductivity, high visible light transmission (VLT) and excellent adhesion of the nano-wire layer 12 to the CNT layer 16. The drawings are highly schematic and not to scale. In particular, the layer thicknesses are greatly exaggerated for ease of illustration.

TCF 10, FIG. 1, can be produced by the following method. Typically, metal nano-wires (e.g., AgNW) are applied to a surface of the substrate 14 (e.g., surface 14a) by a coating process such as but not limited to Mayer rod, spray, gravure, roll, slot die, curtain, and slide. Nanowire layer 12 comprises metal nano-wires distributed across substrate 14 in a random manner. An optional tie layer 18, discussed below, can be applied on the substrate before the nanowire layer. Conductive layer 16 is accomplished with CNT and binder that are applied together over the metal nano-wire layer in any pattern desired (including one or more areas covering some or all of the nanowires, such as areas 21, 22 and 23) by a printing process such as but not limited to screen printing (rotary and sheet), aerosol jet, flexographic, pad, gravure, slot die patch and slide patch. To provide a TCF having a conductivity limited to the pattern of the subsequently applied CNT, the exposed metal nano-wires (if any), i.e., nano-wires not coated with CNT, are removed to provide a TCF having the desired electrical conductivity pattern.

The resulting TCF is a conductive, flexible and stretchable material. Additionally, the areas coated with both metal nano-wire and CNT may have a visible light transmission (VLT) ranging from about 85% to about 97%, and most preferably a VLT of over 98%. The visible light transmission value relates only to the coating of metal nano-wire and CNT; the visible light transmission value does not include the substrate.

Suitable substrates for use in the TCF 10 will have attributes which may include, but are not limited to optical transparency, mechanical dimensional stability, chemical and solvent resistance, stretchability, thermformability, surface treatments (hydrophilic or hydrophobic), surface smoothness, temperature stability. Examples of substrates include but are not limited to polyethyleneterephthalate (PET), polyethylene naphthalate (PEN), polycarbonate, polyarylate, polyether sulfone, polyolefin polyethylene, propylene (PP), co-polymers of poly-1-butene (PB), methyl pentene (TPX), polytetrafluoroethylene (PTFE), polynorbonene, polyimide, cycloalkenes, and glass. Substrate thickness may typically but not necessarily range from about 0.5 microns to about 20 microns.

Suitable nano-wires for use in the nanowire layer of TCF 10 are electrically conductive, dispersible in solvents to enable formulation of a stable ink or coating fluid, have sub-micron features in at least one dimension, have an aspect ratio>1, may be solid or hollow, when coated will form an electrically conductive network on the substrate, will have adequate adhesion to the substrate for processing (which may include the addition of a binder to the formulation), will be removable from the substrate by wiping (if not overcoated). Suitable nano-wires may include but are not limited to AgNW, copper nanowires or other suitable metal nano-wires. The AgNW used in the TCF have diameters typically ranging from about 31 nm to about 50 nm (more generally, from about 5 nm to about 150 nm) and typical lengths of about 11.4 µm to about 20 µm (more generally, from about 5 microns to about 70 microns). The concentration of metal nano-wire per square meter may typically range from about 30 mg/sq meter to about 55 mg/sq meter, or more generally from about 1 mg/m$^2$ to about 100 mg/m$^2$. When using AgNW, its concentration in the solvent for printing the nanowire layer will typically be about 0.1 mg/ml to about 10 mg/ml. The nanowire layer may also include a binder that helps to bind the nanowires to the substrate. Candidate binders include but are not limited to soluble polymers such as polyvinylpyrrolidone, cellulose esters, polyacrylic polymers, and polyvinyl alcohol. The nanowire layer may also include an optical brightener that modifies an optical property of the nanowire layer, such as to reduce the yellow hue that may be associated with AgNW. Candidate optical brighteners are described below.

Carbon nanotubes suitable for use in the conductive layer of TCF 10 are electrically conductive, will form an electrically conductive network when deposited, dispersible in solvents to enable formulation of a stable ink or coating fluid, have sub-micron features in at least one dimension, have one dimension<2 nm, have an aspect ratio>1, will have adequate adhesion to the nanowire layer and the substrate for processing, and will not be removable from the substrate by wiping. Suitable carbon nanotubes include single wall, few-wall, and multiwall tubes. Graphene or metal nanoparticles (such as a silver or other metal nanoparticles) may be added to reduce contact resistance between tubes. As used herein, CNT refers to single wall, multi-wall and few wall tubes. Few-wall tubes are CNT having a median number of walls typically ranging from two to three walls, i.e. a batch of few wall CNT may have some CNT's with greater than three walls; however, the primary component of few wall CNT will have from two to three walls. The CNT used in the examples herein are single wall CNT with a median diameter of about 0.84 nm and diameters ranging from but not limited to about 0.7 nm to about 1.4 nm and a median length of about 1.1 µm and lengths ranging from but not limited to about ~0.3 µm to about 3 µm. The concentration of CNT/square meter may typically range from about 1 mg/sq meter to about 25 mg/sq meter. Typically, the concentration of CNT/square meter will be from about 0.5 mg/m$^2$ to about 5 mg/m$^2$.

The conductive layer also includes a binder which will typically be an organic or inorganic polymer, may allow electron transfer, will be mechanically stable, provide adequate adhesion to the nanowire layer and the substrate for processing, may enhance cohesive strength of the conductive layer, may have a low index of refraction and high visible light transmission, is chemically stable, and can be formulated into the conductive layer to for a stable ink or coating fluid. Suitable binders include conductive polymers such as ionomers, for example. Suitable binders include "Nafion" (a sulfonated tetrafluoroethylene based fluoropolymer-copolymer ionomer); poly(arylene ether sulfone) or "BPS"; sulfonated poly(arylene thioether sulfone) or "PATS"; ethylene copolymers containing acid groups partially neutralized using metal salts such as zinc, sodium and others, or "Surlyn" a copolymer of ethylene and methacrylic acid available from DuPont. As known to those skilled in the art, Nafion is a sulfonated tetrafluoroethylene based fluoropolymer-copolymer discovered in the late 1960s by Walther Grot of DuPont identified as CAS Registry Number 66796-30-3. The Nafion binder can be dissolved in isopropanol prior to addition to the ink solution. Suitable viscosity modifiers (e.g., amine-acid adducts) are described in U.S. Published Patent Application Number 2005/0276924, the disclosure of which is incorporated herein by reference. CNT dispersed in the ink may range from about 0.1 to about 1.5 g/L. The ratio of CNT to binder may be from about 1:0.5 to about 1:50. When using about 0.3 g/L of single wall CNT, the viscosity of the CNT containing ink will be about 15,000 cP at 5 rpm and 9,000 cP at 40 rpm when measured using a Brookfield Viscometer with a LV 4 spindle. The ink is diluted as necessary with an alcohol such as but not limited to 1-propanol to achieve the desired viscosity.

In one embodiment, the TCF disclosed herein may be prepared by the printing processes described above. Typically, the metal nano-wire will be dispersed in a solvent such as ethanol or other solvent suitable for use in the printing processes (e.g., methanol, isopropanol, n-propanol, butanol or water). The amount of metal nano-wires in the dispersion may typically range from about 0.15 to about 1% by weight of the total dispersion, or more generally from about 0.05% to about 5% by weight. In one non-limiting example, a 0.25% by weight dispersion of AgNW in ethanol was used. The dispersion of metal nano-wire is printed or otherwise applied to the surface of the substrate. Prior to applying the dispersion of metal nano-wire, the substrate should be cleaned to remove any particle contamination. Following cleaning, the NW dispersion is applied to the surface of the substrate and drawn down to a wet coating thickness of about 25 µm. The draw down step may use a smooth rod coater and a fixed gap. A Mayer rod may alternatively be used. The dispersion of metal nano-wire is allowed to dry for several seconds, usually under ambient conditions. Subsequently, additional drying takes place by heating, e.g., with a hand-held drier with a 350° F. output for about 30 seconds.

Prior to applying the CNT, the desired pattern for the TCF conductive regions is determined. One or more regions of substrate carrying the nano-wire layer may be taped or masked off to expose only those areas to be coated with CNT, and thus form the ultimate TCF conductive regions. Alternatively, the CNT applied as an ink may be printed in the desired pattern over the metal nano-wires without prior masking of the NW layer. The desired pattern may include the entire area coated with nanowires, which may or may not be the entire area of the substrate.

CNT dispersed in a suitable ink is used to coat the exposed areas of the substrate that carry the nano-wire layer. Inks appropriate for use in applying CNT to the substrate coated with metal nano-wire include but are not limited to solvent-based, surfactant-free, screen printable inks. Additionally, the ink should contain a binder to promote adhesion, and a viscosity modifier to assist the coating process.

Application of the CNT, binder (and optionally the viscosity modifier) containing ink to the desired regions of the substrate carrying the nano-wire layer preferably occurs via a printing process. For example, one suitable process utilizes a 355 polyester mesh screen with a 3 mm snap off distance. The substrate carrying the nano-wire layer is secured to provide a smooth, flat surface. The ink carrying CNT is applied by flooding the screen with ink and drawing the fluid over the desired pattern with a squeegee. Preferably using a 75° squeegee angle, even pressure and speed, the ink is sheared through the screen onto the substrate. Following application of the ink, the TCF is dried by heating with a hand-held convection drier with an air temperature set to 350° F. for about 30 seconds. Final drying may occur under conditions of 105° C. for 10 minutes in a flowing air environment, e.g. in a convection oven set at 105° C. for 10 minutes.

Following application of the CNT ink over the desired regions of nano-wire layer and drying of the ink, those regions free of CNT ink a r e treated to remove the exposed metal nano-wires. Removal of metal nano-wires can be achieved by wiping the surface with a cloth wetted with water. Alternatively the cloth may be wetted with isopropyl alcohol. Alternatively, the surface can be wiped with a cloth wetted with a water/alcohol blend. Alternatively, with a sufficient concentration of Nafion binder, the entire TCF surface may be wiped without detrimentally removing the CNT component.

In some device applications there is a need to have a conductive film structure on one side of a substrate which may be combined in the device with another substrate having a similar or different conductive film structure on the second substrate to provide the desired opto-electronic performance. In other device applications, it can be advantageous to have a conductive film structure on each side of the substrate whereby the two conductive film structures may be similar or different to provide the desired opto-electronic performance. A simplified, non-limiting example is shown in FIG. 2. Substrate 14 has top surface 14a and opposed bottom surface 14b. Optional tie layers 18 and 18a may be applied to these surfaces. Nanowire layers 12 and 12a are applied, followed by conductive layers 16 and 16a. In this example, conductive areas 21-23 one side 14a of substrate 14 run in one direction, and conductive area 24 on opposed side 14b runs in a different (e.g., orthogonal) direction. As stated elsewhere, the arrangement of and pattern of the conductive area(s) on either side of the substrate are a matter of design choice.

The process to make a two sided TCF could include, but not be limited to first coating the nanowire layer on each side of the substrate and then printing the conductive CNT layer on each side of the substrate. The process could also include but not be limited to coating a first nanowire on one side followed by printing the conductive CNT layer on the first nanowire layer, and subsequently repeating this process on the other side of the substrate. The nanowires not coated with the applied CNT layer can be removed either after each TCF structure is coated/printed on each side of the substrate or after both TCF structures are coated/printed on both sides of the substrate.

In one non-limiting example the substrate is a PET treated to create a tie layer that promotes adhesion of inks. A suitable PET is available from TEKRA, A Division of EIS, Inc., 16700 West Lincoln Avenue, New Berlin, Wis. 53151, identified as PET ST505. The PET ST505 has a thickness of about 125 µm.

In another non-limiting case, the substrate is a polycarbonate (PC) film. A suitable PC is available from BAYER MaterialScience, Bayer AG, Kaiser-Wilhelm-Allee 1,51368 Leverkusen, Germany, is Makrofol DE-1-1HC. Since the commercially available PC film generally does not have a tie layer, an additional layer may be added to the structure prior to the nano-wire layer. The tie layer may in one non-limiting example comprise a methylmethacrylate copolymer, dissolved in a suitable solvent. The concentration of the copolymer is typically 0.25% by weight and may typically range from 0.1% to 10% by weight. The solvent may include, but not be limited to ethyl acetate or propyl acetate. The solvent must not chemically dissolve or substantially imbibe into the PC substrate. The tie layer is coated in one example with a Mayer rod at a 7 um wet thickness and may be coated in the range of 5 um to 15 microns. The tie coat dry thickness is typically 0.018 microns and may be coated in the range of 0.01 um to 1 micron. The tie layer polymer may comprise but not be limited to methylmethacrylate copolymer, ethylmethacrylate copolymer, iso-butyl/n-butyl methacrylate copolymer, n-butyl methacrylate polymer, mono, di-, and multifunctional acrylate monomers and oligomers, functional additives having phosphate or carboxylic acid groups, monomers having functional groups such as acids, amines, hydroxyls, multifunctional organosilanes.

The tie layer may also include an additive that is arranged to modify an optical property of the tie layer. The nanowire layer can add a slight yellow hue to the transmitted light. A method commonly used to minimize the impact of a yellow tone from objects is to add an optical brightener into the material. As generally known, optical brightening agents (OBAs), fluorescent brightening agents (FBAs) or fluorescent whitening agents (FWAs) are chemical compounds that absorb light in the ultraviolet and violet region (usually 340-370 nm) of the electromagnetic spectrum, and re-emit light in the blue region (typically 420-470 nm) by fluorescence. Such materials are soluble in solvents and the incorporation of an OBA in the tie layer with the associated addition of blue is expected to offset the yellow hue.

Important properties for a TCF include sheet resistance (Rs), optical transparency (% VLT), chemical resistance, environmental stability, mechanical robustness. Typical values for these properties include but are not limited to Rs from 25 ohms/□ to 450 ohms/□, % VLT from 90% to 99% (without the substrate), resistance to organic solvents and cleaners, stability in hot/dry (85 C/<20% RH) and hot wet (65 C/85% RH), and bend testing (20 or 4 mm bend radius at 1000 repeat bends under tension).

Following are several non-limiting examples of TCFs according to the disclosure, including examples that did not have sufficient adhesion to the substrate to pass the tape test.

Example 1

A TCF prepared using PET ST505 as the substrate, coated with a dispersion of 0.5% by weight AgNW in ethanol followed by coating with a CNT ink containing 0.3 g/L of single wall CNT, and Nafion binder at a ratio of 50:1 with the single wall CNT.

The TCF of this example was printed with two different coverages of CNT. Single wall CNT coverage of 10 mg/m$^2$ resulted in about 85% visible light transmission (VLT). Single wall CNT coverage of 3 mg/m$^2$ resulted in about 95-97% VLT. Selective removal of AgNW from the non-CNT printed areas resulted in electrical isolation of the CNT printed areas. Prior to wiping between CNT printed areas, the resistivity ranged from 40-100 ohm/square. After wiping these areas had a resistivity reading of infinite, thus isolating the CNT printed areas.

Resistivity measurements for the TCF printed with 3 mg/m$^2$ and having about 95-97% VLT (not including substrate value in the VLT) were determined. Prior to removing the non-coated AgNW, this region had sheet resistance measuring from 40 ohms/square to infinite (difficulties were encountered with testing these regions). To provide a comparison between the desired TCF and a substrate coated only with CNT, a CNT treated substrate was also prepared. This substrate had a resistivity of 10,000 ohm/square. In contrast, the desired TCF carrying AgNW overcoated with single wall CNT as described above had a sheet resistance range of about 40 to about 100 ohm/square and a VLT of about 88 to 93% when including the substrate in the measurement of VLT.

Additionally, the TCF was tested to determine the stability of the CNT coated areas and removal of the AgNW. To determine the adhesion of the CNT coated areas, an adhesive tape obtain from 3M (3M 510 tape) was applied to the CNT coated areas and removed. The CNT coated areas showed good adhesion, i.e. were not removed, from the substrate. Mechanisms for removing non-CNT coated AgNW were also tested. Adhesive tape and liquid rinsing only with water, isopropyl alcohol and water/isopropyl alcohol did not remove the AgNW. Wet wiping with water or isopropyl alcohol did successfully remove the AgNW. Excessive force during wet wiping may also remove a portion of the CNT coating.

Example 2

Polyester (PET) film, Melinex ST505 (125 um), was used as the substrate. A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MW 40,000, Sigma Aldrich, CAS9003-39-8). The AgNW coating was ~5 inches wide. The fluid was coated onto the PET film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-99% (subtracting the substrate VLT), had a haze value ~0.7%, and had a sheet resistance of ~100-150 ohms/□ (square). The printed CNT layer only on the PET substrate had a % VLT (visible light transmission) of ~99-100% (subtracting the substrate VLT) and had a sheet resistance of ~50,000 ohms/□. After the CNT printing and wet wiping was completed the full structure had a % VLT (visible light transmission) of ~99% (subtracting the substrate VLT) and had a sheet resistance of ~75 ohms/□. An adhesion test using 3M 510 tape passed.

Example 3

Polyester (PET) film, Melinex ST505 (125 um), was used as the substrate. A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MW 40,000, Sigma Aldrich, CAS9003-39-8). The AgNW coating was ~5 inches wide. The fluid was coated onto the PET film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 few wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 20:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-99% (subtracting the substrate VLT), an expected haze value was ~0.7% (visual comparison), and had a sheet resistance of ~100-150 ohms/□. The printed CNT layer only on the PET substrate had a % VLT (visible light transmission) of ~97-98% (subtracting the substrate VLT) and had a sheet resistance of ~4,500,000 ohms/□. After the CNT printing and wet wiping was completed the full structure had a % VLT (visible light transmission) of ~96% (subtracting the substrate VLT) and had a sheet resistance of ~75 ohms/□. An adhesion test using 3M 510 tape passed.

Example 4

Polyester (PET) film, Melinex ST505 (125 um), was used as the substrate. A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MW 40,000, Sigma Aldrich, CAS9003-39-8). The AgNW coating was ~5 inches wide. The fluid was coated onto the PET film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 10:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for~30 seconds to remove all of the water. After the AgNW coating, the % VLT (visible light transmission) was ~98-99% (subtracting the substrate VLT), an expected haze value was ~0.7% (visual comparison), and had a sheet resistance of ~100-150 ohms/□. The printed CNT layer only on the PET substrate had a % VLT (visible light transmission) of ~97-98% (subtracting the substrate VLT) and had a sheet resistance of ~20,000 ohms/□. After the CNT printing and wet wiping was completed the full structure had a % VLT (visible light transmission) of ~96% (subtracting the substrate VLT) and had a sheet resistance of ~75 ohms/□. An adhesion test using 3M 510 tape failed.

Example 5

Polyester (PET) film, Melinex ST505 (125 um), was used as the substrate. A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MW 40,000, Sigma Aldrich, CAS9003-39-8). The AgNW coating was ~5 inches wide. The fluid was coated onto the PET film using a #12 Mayer rod (~100 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~96-97% (subtracting the substrate VLT), had a haze value ~1.5%, and had a sheet resistance of ~40 ohms/□. The printed CNT layer only on the PET substrate had a % VLT (visible light transmission) of ~99-100% (subtracting the substrate VLT) and had a sheet resistance of 50,000 ohms/□. After the CNT printing and wet wiping was completed the full structure had a % VLT (visible light transmission) of ~97% (subtracting the substrate VLT) and had a sheet resistance of ~25 ohm/□. An adhesion test using 3M 510 tape passed.

Example 6

Polyester (PET) film, Melinex ST505 (125 um), was used as the substrate. A silver nanowire (AgNW) (~20 nm diameter; 20 um length) dispersion was prepared to yield 0.25% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PET film using a #6 Mayer rod (~25 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-100% (subtracting the substrate VLT), an expected haze value was ~0.3% (visual comparison), and had a sheet resistance of ~700 ohms/□. The printed CNT layer only on the PET substrate had a % VLT (visible light transmission) of ~99-100% (subtracting the substrate VLT) and had a sheet resistance of 50,000 ohms/□. After the CNT printing and wet wiping was completed the full structure had a % VLT (visible light transmission) of ~99% (subtracting the substrate VLT) and had a sheet resistance of ~450 ohms/□. An adhesion test using 3M 510 tape passed.

Example 7

Polyester (PET) film, Melinex ST505 (125 um), was used as the substrate. A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PET film using a #6 Mayer rod (~55 mg/m2

AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.1 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-~99% (subtracting the substrate VLT), an expected haze value was ~0.7% (visual comparison), and had a sheet resistance of ~100-150 ohms/□. The printed CNT layer only on the PET substrate had a % VLT (visible light transmission) of ~99-100% (subtracting the substrate VLT) and had a sheet resistance of ~5,500,000 ohms/□. After the CNT printing was completed the full structure had a % VLT (visible light transmission) of ~99% (subtracting the substrate VLT) and had a sheet resistance of ~110 ohms/□. An adhesion test using 3M 510 tape failed.

Example 8

Polyester (PET) film, Melinex ST505 (125 um), was used as the substrate. A silver nanowire (AgNW) (~20 nm diameter; 20 um) dispersion was prepared to yield 0.35% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PET film using a #6 Mayer rod (~35 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.65 g/liter and to include Nafion (Aldrich 510211) at a 3:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-100% (subtracting the substrate VLT), an expected haze value was ~0.5% (visual comparison), and had a sheet resistance of ~150-300 ohms/□. The printed CNT layer only on the PET substrate had a % VLT (visible light transmission) of ~90% (subtracting the substrate VLT) and had a sheet resistance of ~2,000 ohms/□. After the CNT printing and wet wiping was completed the full structure had a % VLT (visible light transmission) of ~90% (subtracting the substrate VLT) and had a sheet resistance of ~100 ohms/□. An adhesion test using 3M 510 tape passed.

Example 9

Polyester (PET) film, Melinex ST505 (125 um), was used as the substrate. A silver nanowire (AgNW) (~20 nm diameter; 20 um) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PET film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a coarse felt fabric which was wetted with DI water as a single pass wipe. Minimal pressure was used to wipe the film. Significant scratches occurred in the coated structure. The film was dried with a hand held convection dryer set to 177 C exit air temperature for ~30 seconds to remove all of the water. After the AgNW coating, the % VLT (visible light transmission) was ~98-~99% (subtracting the substrate VLT), an expected haze value was ~0.7% (visual comparison), and had a sheet resistance of ~100-150 ohms/□. The printed CNT layer only on the PET substrate had a % VLT (visible light transmission) of ~99-100% (subtracting the substrate VLT) and had a sheet resistance of ~50,000 ohms/□. After the CNT printing and wet wiping was completed the full structure had a % VLT (visible light transmission) of ~99% (subtracting the substrate VLT) and had a sheet resistance of which could not be measured due to scratches.

Example 10

Polyester (PET) film, Melinex ST505 (125 um), was used as the substrate. A silver nanowire (AgNW) (~20 nm diameter; 20 um) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PET film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a stiff felt fabric which was wetted with DI water as a single pass wipe. Minimal pressure was used to wipe the film. Significant scratches occurred in the coated structure. The film was dried with a hand held convection dryer set to 177 C exit air temperature for ~30 seconds to remove all of the water. After the AgNW coating, the % VLT (visible light transmission) was ~98-99% (subtracting the substrate VLT), an expected haze value was ~0.7% (visual comparison), and had a sheet resistance of ~100-150 ohms/$\square$. The printed CNT layer only on the PET substrate had a % VLT (visible light transmission) of ~99-100% (subtracting the substrate VLT) and had a sheet resistance of ~50,000 ohms/$\square$. After the CNT printing and wet wiping was completed the full structure had a % VLT (visible light transmission) of ~99% (subtracting the substrate VLT) and had a sheet resistance of which could not be measured due to scratches.

Example 11

Polycarbonate (PC) film, Makrofol DE-1-1HC (175 um), was used as the substrate. A silver nanowire (AgNW) (~20 nm diameter; 20 um) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PC film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~99% (subtracting the substrate VLT), an expected haze value was ~0.7% (visual comparison), and had a sheet resistance of ~100-150 ohms/$\square$. The printed CNT layer only on the PC substrate had a % VLT (visible light transmission) of ~99-100% (subtracting the substrate VLT) and had a sheet resistance of ~50,000 ohms/$\square$. After the CNT printing and wet wiping was completed the full structure had a % VLT (visible light transmission) of ~99% (subtracting the substrate VLT) and had a sheet resistance of ~75 ohms/$\square$. An adhesion test using 3M 510 tape failed.

Example 12

Polycarbonate (PC) film, Makrofol DE-1-1HC (175 um), was used as the substrate. A 5% by weight Nafion fluid was coated onto the substrate surface using a #6 Mayer rod. The coating was dried with a hand held convection dryer set to 177 C exit air temperature for ~30 seconds. The coated structure was then placed in a standard lab convection oven for 10 minutes at 105 C. The sample was allowed to cool to ambient temperature (~25 C). An adhesion test using 3M 510 tape failed.

Example 13

Polycarbonate (PC) film, Makrofol DE-1-1HC (175 um), was used as the substrate. A 5% by weight PSS (Poly (styrene-ran-ethylene), sulfonated (Aldrich 659401) fluid was coated onto the substrate surface using a #6 Mayer rod. The coating was dried with a hand held convection dryer set to 177 C exit air temperature for ~30 seconds. The coated structure was then placed in a standard lab convection oven for 10 minutes at 105 C. The sample was allowed to cool to ambient temperature (~25 C). An adhesion test using 3M 510 tape passed.

Example 14

Polycarbonate (PC) film, Makrofol DE-1-1HC (175 um), was used as the substrate. A silver nanowire (AgNW) (~20 nm diameter; 20 um) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PC film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include PSS (Poly(styrene-ran-ethylene), sulfonated (Aldrich 659401) at a 50:1 ratio of PSS/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-99% (subtracting the substrate VLT), an expected haze value was ~0.7% (visual comparison), and had a sheet resistance of ~100-150 ohms/$\square$. The printed CNT layer only on the PC substrate had a % VLT (visible light transmission) of ~97-98% (subtracting the substrate VLT) and had a sheet resistance of ~3,000,000 ohms/$\square$. After the CNT printing and wet wiping was completed the full structure had a % VLT (visible light transmission) of ~96% (subtracting the substrate VLT) and had a sheet resistance of ~75 ohms/$\square$. An adhesion test using 3M 510 tape failed.

Example 15

Polycarbonate (PC) film, Makrofol DE-1-1HC (175 um), was used as the substrate. An adhesion promoting tie layer of methylmethacrylate copolymer (Elvacite 2028) was prepared to a 0.25% by weight in propyl acetate. The fluid was coated with a #3 Mayer rod (~0.018 g/m2). The coating was dried with a hand held convection dryer set to 177 C exit air temperature for ~30 seconds.

A silver nanowire (AgNW) (~20 nm diameter; 20 um length) dispersion was prepared to yield 0.55% by weight AgNW fluid in isopropyl alcohol (IPA) having a 5.24:1 ratio of AgNW to a binder (polyvinylpyrrolidone (PVP): MV 40,000, Sigma Aldrich, CAS9003-39-8). The AgNW coating was ~5 inches wide. The fluid was coated onto the PC/tie layer film using a #6 Mayer rod (~55 mg/m2 AgNW). The coating was dried with a hand held convection dryer set to 177 C exit air temperature for ~30 seconds. The AgNW was overprinted with a carbon nanotube ink (VC101 single wall CNT ink from Chasm Technologies Inc) using a 355 mesh polyester screen having a 3 inch square block pattern. The ink was reformulated to a CNT concentration of ~0.3 g/liter and to include Nafion (Aldrich 510211) at a 50:1 ratio of Nafion/CNT. The printed CNT layer was dried with a hand held convection dryer set to 177 C exit air temperature for ~15 seconds. The coated structure was then placed in a standard lab convection oven for 10 minutes at 105 C. The sample was allowed to cool to ambient temperature (~25 C). The sample was wiped with a soft felt fabric which was wetted with DI water as a single pass wipe. Minimal pressure was used to wipe the film. The film was dried with a hand held convection dryer set to 177 C exit air temperature for ~30 seconds to remove all of the water. After the AgNW coating, the % VLT (visible light transmission) was ~98-99% (subtracting the substrate VLT), an expected haze value was ~0.7% (visual comparison), and had a sheet resistance of ~100-150 ohms/□. The printed CNT layer only on the PC substrate had a % VLT (visible light transmission) of ~99-100% (subtracting the substrate VLT) and had a sheet resistance of ~50,000 ohms/□. After the CNT printing and wet wiping was completed the full structure had a % VLT (visible light transmission) of ~99% (subtracting the substrate VLT) and had a sheet resistance of ~75 ohms/□. An adhesion test using 3M 510 tape passed.

Example 16

A TCF as described in Example 2 was held in different environmental conditions to assess changes of the sheet resistance (Rs) results. A sample held for 300 at room temperature, 25 C/50% RH showed no change in Rs. A sample held for 300 in "hot/wet" conditions, 65 C/85% RH showed only <2% increase in Rs. A sample held for 300 in "hot/dry" conditions, 85 C/<20% RH, showed a greater than 200% increase in Rs. When this sample was covered with a sheet of PET film, the Rs value did not increase.

A number of implementations have been described. Nevertheless, it will be understood that additional modifications may be made without departing from the scope of the inventive concepts described herein, and, accordingly, other embodiments are within the scope of the following claims.

What is claimed is:

1. A transparent conductive film (TCF), comprising:
a substrate having a surface;
a layer of metal nanowires on top of some but not all of the surface of the substrate; and
a conductive layer printed on top of and covering all of the layer of metal nanowires, leaving some of the substrate surface not covered with metal nanowires or the conductive layer, wherein the conductive layer is printed with an ink that comprises carbon nanotubes (CNT) and a binder, wherein a ratio of binder to CNT in the ink is between 10:1 and 50:1 and wherein the CNT coverage in the conductive layer is from 3 mg CNT/m$^2$ to 10 mg CNT/m$^2$;
wherein the metal nanowire layer and the conductive layer together have a visible light transmission from about 95% to about 100%.

2. The TCF of claim 1, wherein the nanowires comprise silver or copper nanowires.

3. The TCF of claim 1, wherein the nanowire layer comprises a nanowire binder.

4. The TCF of claim 1, wherein the nanowire layer comprises an optical brightener that is arranged to modify an optical property of the nanowire layer.

5. The TCF of claim 1, wherein the nanowire layer comprises from about 10 mg/m$^2$ to about 100 mg/m$^2$ nanowires.

6. The TCF of claim 1, wherein the conductive layer binder comprises a polymer.

7. The TCF of claim 6, wherein the conductive layer binder comprises an ionomer.

8. The TCF of claim 7, wherein the conductive layer binder comprises a sulfonated tetrafluoroethylene based fluoropolymer-copolymer.

9. The TCF of claim 1, wherein the conductive layer binder has an index of refraction no greater than about 1.5.

10. The TCF of claim 1, wherein the conductive layer further comprises a viscosity modifier.

11. The TCF of claim 1, wherein the conductive layer further comprises at least one of conductive nanoparticles and graphene.

12. The TCF of claim 1, further comprising a tie layer on the substrate that promotes adhesion to the substrate of at least one of the nanowires and the CNT.

13. The TCF of claim 12, wherein the tie layer comprises an additive that is arranged to modify an optical property of the tie layer.

14. The TCF of claim 12, wherein the tie layer comprises a polymer.

15. The TCF of claim 14, wherein the polymer comprises a methylmethacrylate copolymer.

16. The TCF of claim 1, wherein the substrate has two opposed surfaces; wherein there are two nanowire layers, one each on some but not all of both of the two opposed surfaces; and wherein there is a conductive layer entirely covering both nanowire layers.

17. The TCF of claim 1, wherein the ratio of binder to CNT in the ink is 50:1.

18. A transparent conductive film (TCF), comprising:
a substrate having a surface;
a metal nanowire layer of silver or copper nanowires on top of some but not all of the surface of the substrate, wherein the metal nanowire layer comprises from about 10 mg/m$^2$ to about 100 mg/m$^2$ silver or copper metal nanowires; and
a conductive layer printed on top of and covering all of the layer of metal nanowires, leaving some of the substrate surface not covered with metal nanowires or the conductive layer, wherein the conductive layer is printed with an ink that comprises carbon nanotubes (CNT) and a sulfonated tetrafluoroethylene based fluoropolymer-copolymer binder, wherein a ratio of binder to CNT in the ink is between 10:1 and 50:1, and wherein the CNT coverage in the conductive layer is from 3 mg CNT/m$^2$ to 10 mg CNT/m$^2$;
wherein the metal nanowire layer and the conductive layer together have a visible light transmission from about 95% to about 100%.

19. The TCF of claim 18, wherein the ratio of binder to CNT in the ink is 50:1.

20. The TCF of claim 1, wherein the metal nanowire layer and the conductive layer together have a visible light transmission from about 98% to about 99%.

21. The TCF of claim 18, wherein the metal nanowire layer and the conductive layer together have a visible light transmission from about 98% to about 99%.

* * * * *